(12) United States Patent
Ishiguro

(10) Patent No.: US 7,639,085 B2
(45) Date of Patent: Dec. 29, 2009

(54) AUTOMATIC GAIN CONTROL CIRCUIT

(75) Inventor: Kazuhisa Ishiguro, Gunma (JP)

(73) Assignee: Ricoh Co., Ltd., Tokyo (JP)

( * ) Notice: Subject to any disclaimer, the term of this patent is extended or adjusted under 35 U.S.C. 154(b) by 78 days.

(21) Appl. No.: 11/915,313

(22) PCT Filed: Dec. 19, 2005

(86) PCT No.: PCT/JP2005/023690

§ 371 (c)(1),
(2), (4) Date: Nov. 21, 2007

(87) PCT Pub. No.: WO2006/126301

PCT Pub. Date: Nov. 30, 2006

(65) Prior Publication Data

US 2009/0103668 A1   Apr. 23, 2009

(30) Foreign Application Priority Data

May 23, 2005   (JP) ............................. 2005-149962

(51) Int. Cl.
*H03F 3/04* (2006.01)

(52) U.S. Cl. ..................................... 330/311

(58) Field of Classification Search ................ 330/311, 330/254, 285; 327/347
See application file for complete search history.

(56) References Cited

U.S. PATENT DOCUMENTS

| 6,046,640 | A  | * | 4/2000 | Brunner ....................... 330/254 |
| 7,072,427 | B2 | * | 7/2006 | Rawlins et al. ............... 375/346 |
| 2002/0067213 | A1 | * | 6/2002 | Miyabe et al. ............... 330/311 |

FOREIGN PATENT DOCUMENTS

| JP | 57-011512 | 1/1982 |
| JP | 57-208718 | 12/1982 |
| WO | WO-03/028210 A1 | 4/2003 |

* cited by examiner

*Primary Examiner*—Robert Pascal
*Assistant Examiner*—Khiem D Nguyen
(74) *Attorney, Agent, or Firm*—Connolly Bove Lodge & Hutz LLP

(57) ABSTRACT

A first MOS transistor (M1) and a second MOS transistor (M2) constitute a cascode amplifier. The second MOS transistor (M2) is in a differential connection with a gain control MOS transistor (M4), which has its gate supplied with an AGC control voltage (VAGC), and it is arranged that the device area ratio of the second MOS transistor (M2) to the gain control MOS transistor (M4) is one to N (where $N \geq 1$). In this way, even in a region where the AGC control voltage (VAGC) is small, abrupt variations of the gain can be suppressed, while the drain current of the first MOS transistor (M1) can be kept constant independently of the gain control.

2 Claims, 9 Drawing Sheets

|  | A | B | C |
|---|---|---|---|
| M1 | $V_{ds} \approx 0V$<br>$V_{gs} > V_{th}$<br>$I_d \approx 0$ | $0 < V_{ds} < V_{gs} - V_{th}$<br>$V_{gs} > V_{th}$<br>$0 < I_d < I_{ref}$ | $V_{ds} > V_{gs} - V_{th}$<br>$V_{gs} > V_{th}$<br>$I_d = I_{ref}$ |
| OPERATIONAL POINT | NONSATURATED REGION (LINEAR REGION) | NONSATURATED REGION (LINEAR REGION) | SATURATED REGION |

Fig. 13

[NONSATURATED REGION]

$$Id = K' \frac{W}{L}\left[(Vgs - Vth) - \frac{Vds}{2}\right]Vds \quad \cdots \quad \text{(EXPRESSION 1)}$$

$$K' = \mu_0 Cox$$

[SATURATED REGION]

$$Id = \frac{1}{2}K'\frac{W}{L}(Vgs - Vth)^2 \quad \cdots \quad \text{(EXPRESSION 2)}$$

Fig. 14

[NONSATURATED REGION]

$$gm = \frac{\partial Id}{\partial Vgs} = K'\frac{W}{L}Vds \quad \cdots \quad \text{(EXPRESSION 3)}$$

[SATURATED REGION]

$$gm = \frac{\partial Id}{\partial Vgs} = \sqrt{2K'\frac{W}{L}Id} \quad \cdots \quad \text{(EXPRESSION 4)}$$

Fig. 15

$$(Vgs - Vth)^2 = VAGC$$

$$\therefore Vgs = \sqrt{VAGC} + Vth \quad \cdots \quad \text{(EXPRESSION 5)}$$

US 7,639,085 B2

AUTOMATIC GAIN CONTROL CIRCUIT

RELATED APPLICATIONS

This application is a national stage application (under 35 U.S.C. § 371) of PCT/JP2005/023690 filed Dec. 19, 2005, which claims benefit of Japanese application 2005-149962 filed Dec. 23, 2005, disclosure of which is incorporated herein by reference.

FIELD OF THE INVENTION

The present invention relates to an automatic gain control circuit, and particularly relates to a circuit that controls a gain of a signal received in wireless communication equipment such as a radio receiver.

BACKGROUND OF THE INVENTION

Generally, wireless communication equipment such as a radio receiver is provided with an AGC (automatic gain control) circuit for adjusting a gain of a received signal. An RF (radio frequency) AGC circuit adjusts an amplification gain of an RF signal received at an antenna to keep the level of the received signal constant.

FIG. 1 is a view showing a configuration of a conventional automatic gain control circuit. In FIG. 1, a first MOS transistor M1 and a second MOS transistor M2 constitute a cascode amplifier. Since basically making no feedback from an output to an input, the cascode amplifier is in frequent used as a high frequency amplifier (e.g. LNA: low noise amplifier).

Specifically, the cascode amplifier is configured as follows. A source of the first MOS transistor M1 is grounded, and a drain thereof is connected with a source of the second MOS transistor M2. A drain of the second MOS transistor M2 is connected with an output terminal OUT via a load Z. The gate of the first MOS transistor M1 is supplied with an antenna input signal from an input terminal IN, and the gate of the second MOS transistor M2 is supplied with an AGC control voltage VAGC.

The third MOS transistor M3 is current-mirror connected to the first MOS transistor M1. Namely, while the gates of the first MOS transistor M1 and the third MOS transistor M3 are connected in common via a resistance R1, sources thereof are grounded. Further, the gate of the third MOS transistor M3 is connected to a drain thereof itself, and the drain is connected with a constant current circuit I.

Next, the operation of the conventional automatic gain control circuit configured as in FIG. 1 is described. An antenna input signal (received signal) inputted from the input terminal IN is amplified by the cascode amplifier comprised of the first MOS transistor M1 and the second MOS transistor M2, and thereafter, outputted from the output terminal OUT through the load Z connected to the drain of the second MOS transistor M2.

The operation of the AGC is realized by controlling the AGC control voltage VAGC which is inputted into the gate of the second MOS transistor M2. For example, when an interference wave is detected from a received signal and thus a gain of the automatic gain control circuit needs to be attenuated, the AGC control voltage VAGC which is inputted into the gate of the second MOS transistor M2 is decreased, to realize the attenuation of the gain.

However, in the conventional automatic gain control circuit shown in above FIG. 1, since the relation between a gate voltage and a drain current in the MOS transistor is originally not linear, an AGC control characteristic as shown in FIG. 2 is obtained. As seen from this FIG. 2, especially in a region where the AGC control voltage VAGC is smaller than 1 V, a gain not larger than 20 dB is greatly changes, and a change in gain with respect to a change in AGC control voltage VAGC becomes critical. A gain control sensitivity thereby becomes too high in this region, which causes a problem of making minute gain control difficult.

Namely, when a cascode amplifier is to be gain controlled, a method of applying the AGC control voltage VAGC to the gate of the gate grounded second MOS transistor M2 to perform gain control is generally adopted. In this case, when the AGC control voltage VAGC is small, a drain-source voltage Vds in the source grounded first MOS transistor M1 becomes small, and thereby the first MOS transistor M1 is operated in a nonsaturated region. Therefore, mutual conductance gm of the first MOS transistor M1 is changed to perform gain control. However, since the mutual conductance gm is proportional to the drain-source voltage Vds in the nonsaturated region, a gain expressed in decibels abruptly changes with respect to the AGC control voltage VAGC.

Moreover, since the first MOS transistor M1 operates in the nonsaturated region when the AGC control voltage VAGC is small, an ON resistance of the first MOS transistor M1 is modulated by an input signal, and distortion thus occurs. Hence there has been a problem in that, when an input signal is phase modulated, it appears as noise.

In addition, there is provided a technique of providing a bias circuit A1 which converts an inputted control voltage Vc' into Vc to obtain a linear relation between the control voltage Vc' and a decibel gain (e.g. see Patent Document 1). Specifically, a gate width of an electric field effect transistor provided in the bias circuit A1 is selected so as to obtain the linear relation between the control voltage Vc' and the decibel gain.

Patent Document 1: Japanese Patent Laid-Open No. 2002-141758

DISCLOSURE OF THE INVENTION

However, in the technique described in Patent Document 1, there is a problem in that, since a drain current in the cascode amplifier is changed to control a gain, a dynamic range, a noise function (NF) and the like change due to the AGC control and thus the optimum AGC control characteristics thereof cannot be realized. Since the change in drain current for the gain control is realized by directly controlling a gate voltage of an electric field effect transistor 401, the change in drain current with respect to the control voltage becomes critical, which is disadvantageous in terms of process, an environmental change, and the like.

Namely, as seen from FIG. 12 of Patent Document 1, a change in control voltage Vc' with respect to a change in gain of 0 to 15 dB is only 0.4 V, and the change in gain with respect to the control voltage Vc' is critical. Further, since the AGC control is normally performed with a gain not smaller than 0 dB, expanding linearity in a control range not larger than 0 dB as in FIG. 12 is not practical.

The present invention was made in order to solve the problems as described above, and has an object to enable lowering of a gain control sensitivity so as to facilitate setting of a dynamic range, a noise function and the like to the optimum values.

For solving the above-mentioned problems, in an automatic gain control circuit of the present invention, a gain control MOS transistor is differentially connected to a second MOS transistor among a first MOS transistor and the second MOS transistor constituting the cascode amplifier, and a fixed bias voltage is supplied to a gate of the second MOS transistor while a gain control voltage is supplied to a gate of the gain control MOS transistor. Further, a device area ratio of the second MOS transistor to the gain control MOS transistor is made to be one to N (N≧1).

In another aspect of the present invention, an interface circuit is further provided which is inputted with a gain control voltage and performs function conversion of this voltage, to supply the gain control voltage after converted to the gate of the gain control MOS transistor.

As an example of the function conversion, function conversion using a square root calculation can be applied. Further, linear approximation conversion can also be performed which makes a linear function, representing a gain control characteristic in a first region where the gain control voltage is larger than a threshold, approximate to a linear function representing a gain control characteristic in a second region where the gain control voltage is not larger than the threshold.

According to the present invention configured as described above, it is possible to lower sensitivity of a change in gain with respect to a change in gain control voltage, so as to suppress an abrupt change in gain even in a region where the gain control voltage is small. Furthermore, the drain current in the first MOS transistor can be made constant independently of the gain control, thereby to facilitate setting of a dynamic range, a noise function and the like to the optimum values. Moreover, according to another aspect of the present invention, the sensitivity of the change in gain with respect to the gain control voltage can be lowered even in a region where the gain control voltage is relatively large.

BRIEF DESCRIPTION OF THE DRAWINGS

FIG. 13 is a view showing relational expressions of a drain current in a saturated region and a nonsaturated region.

FIG. 14 is a view showing expressions of mutual conductance in the saturated region and the nonsaturated region; and FIG. 15 is a view showing an expression to convert an AGC control voltage into a gate application voltage by use of square root calculation.

DETAILED DESCRIPTION OF THE PREFERRED EMBODIMENTS

First Embodiment

Figure 3:
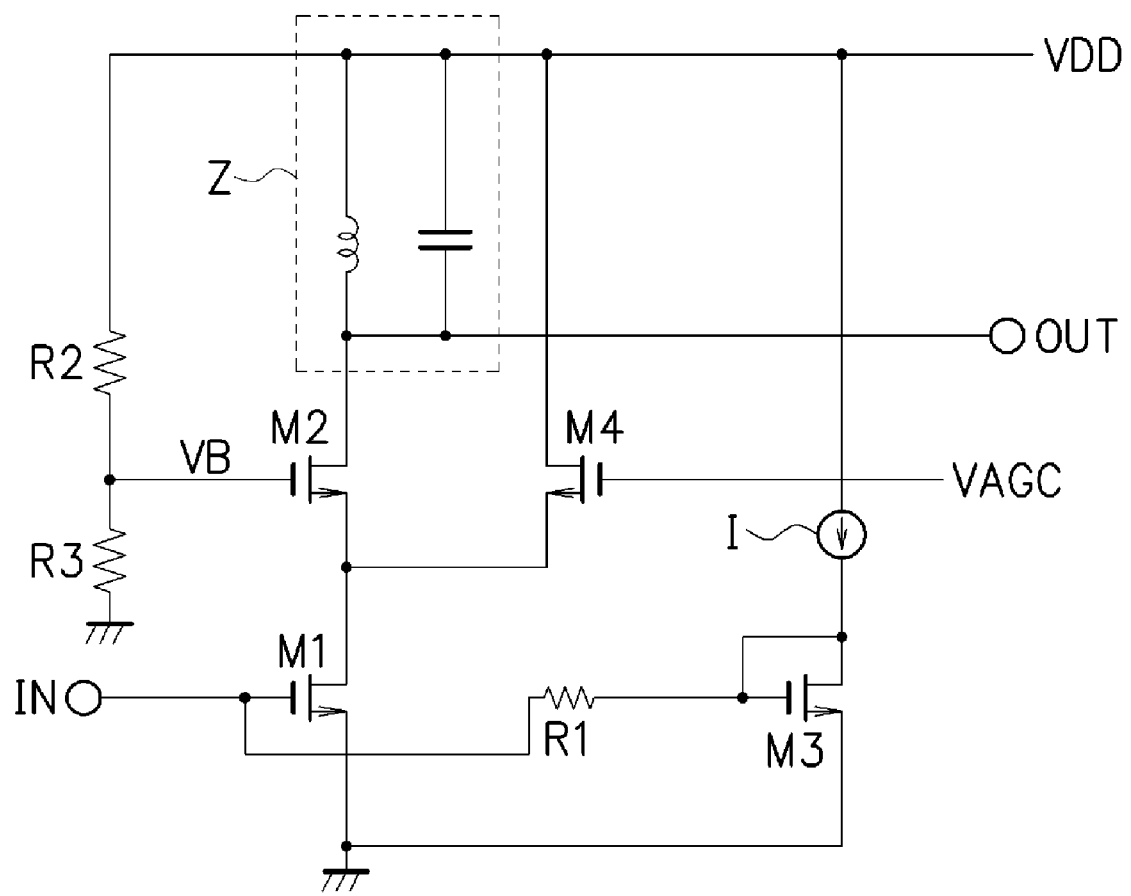
FIG. 3 is a view showing a constitutional example of an automatic gain control circuit according to a first embodiment.

In the following, a first embodiment of the present invention is described based upon drawings. FIG. 3 is a view showing a constitutional example of an automatic gain control circuit according to the first embodiment.

As shown in FIG. 3, a first MOS transistor M1 and a second MOS transistor M2 constitute a cascode amplifier. A source of the first MOS transistor M1 is grounded, and a drain thereof is connected with a source of the second MOS transistor M2. The drain of the second MOS transistor M2 is connected with an output terminal OUT via a load Z. The load Z is connected between the drain of the second MOS transistor M2 and a power source VDD.

A gate of the first MOS transistor M1 is connected to an input terminal IN of a signal, and supplied with an antenna input signal. Further, a gate of the second MOS transistor M2 is supplied with a fixed bias voltage VB. The magnitude of this fixed bias voltage VB is determined according to voltage dividing resistances R2 and R3 which are serially connected between the power source VDD and the ground.

The first MOS transistor M1 is current-mirror connected with a third MOS transistor M3. Namely, the gates of the first MOS transistor M1 and the third MOS transistor M3 are connected in common via a resistance R1 while the sources thereof are grounded. Further, a gate of the third MOS transistor M3 is connected to a drain thereof itself, and that drain is connected with a constant current circuit I. The constant current circuit I is connected between the drain of the third MOS transistor M3 and the power source VDD.

In the present embodiment, a fourth MOS transistor M4 (corresponding to the gain control MOS transistor of the present invention) is further provided. The fourth MOS transistor M4 is differentially connected to the second MOS transistor M2. Namely, the source of the second MOS transistor M2 and a source of the fourth MOS transistor M4 are connected to each other, and a drain of the fourth MOS transistor M4 is connected to the power source VDD.

A gate of the fourth MOS transistor M4 is formed so as to be supplied with an AGC control voltage VAGC (gain control voltage of the present invention) at its gate. Further, channel widths and channel lengths of the second MOS transistor M2 and the fourth MOS transistor M4 are designed such that a device area ratio of the second MOS transistor M2 to the fourth MOS transistor M4 is one to N (N≧1).

Next, the operation of the automatic gain control circuit according to the present embodiment configured as described above is described. The antenna input signal (received signal) inputted from the input terminal IN is amplified by the cascode amplifier comprised of the first MOS transistor M1 and the second MOS transistor M2, and then outputted from the output terminal OUT through the load Z connected to the drain of the second MOS transistor M2.

The operation of the AGC is realized by controlling the AGC control voltage VAGC which is inputted into the gate of the fourth MOS transistor M4 differentially connected to the second MOS transistor M2. For example, when an interference wave is detected from a received signal and thus a gain of the automatic gain control circuit needs to be attenuated, the AGC control voltage VAGC which is inputted to the gate of the fourth MOS transistor M4 is increased by a control circuit, not shown, to realize the attenuation of the gain.

Figure 1:
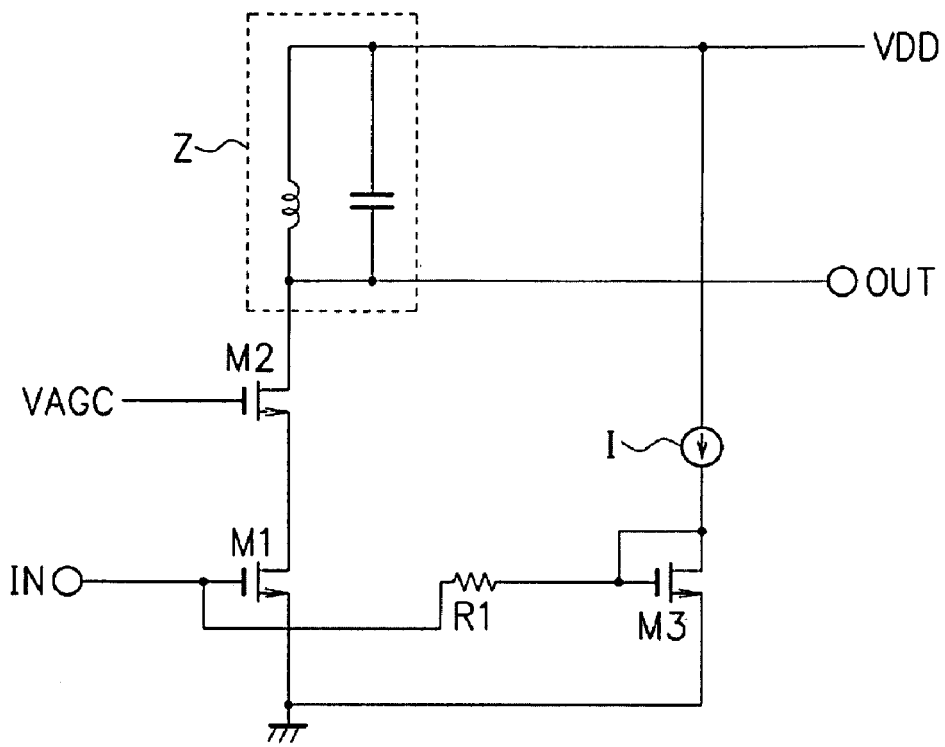
FIG. 1 is a view showing a constitutional example of a conventional automatic gain control circuit.

Here, operational points of the first MOS transistor M1 and the second MOS transistor M2 in the automatic gain control circuit of the present embodiment are described. For facilitating comparison with the conventional case, an operational point of the first MOS transistor M1 in the conventional automatic gain control circuit configured as in FIG. 1 is first examined before description of the present embodiment.

Figures 4A, 4B:
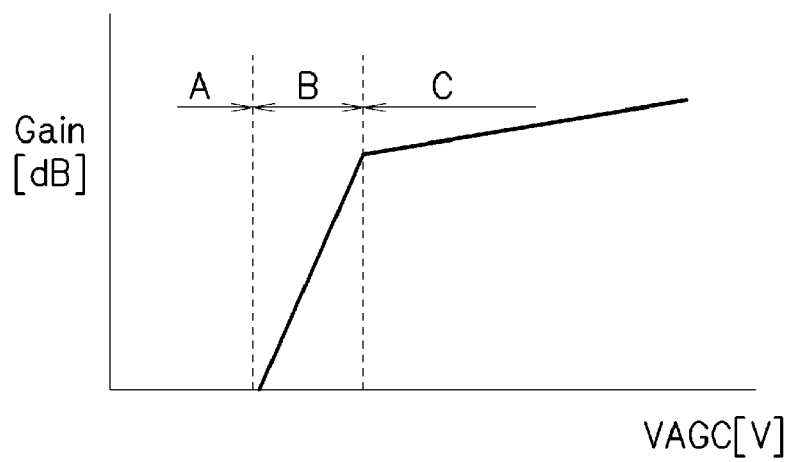
FIGS. 4A and 4B are views showing a change in operational point of a first MOS transistor M1 with a change in AGC control voltage VAGC in regard to the conventional automatic control circuit.

FIGS. 4A and 4B are views showing a change in operational point of the first MOS transistor M1 with a change in AGC control voltage VAGC in regard to the conventional automatic gain control circuit. It is to be noted that in FIG. 4B, symbol Vds denotes a drain-source voltage in the first MOS transistor M1, symbol Vgs denotes a gate-source voltage in the first MOS transistor M1, symbol Vth denotes a threshold voltage in the first MOS transistor M1, symbol Id denotes a drain current in the first MOS transistor M1, and symbol Iref denotes a drain current of the third MOS transistor M3 (constant current in the constant current circuit I).

As shown in FIG. 4, according to the magnitude of the AGC control voltage VAGC, the operational point of the first MOS transistor M1 is changed between a nonsaturated region and a saturated region. In a region where the AGC control voltage VAGC is large and the condition: Vds≧Vgs−Vth, is satisfied, the first MOS transistor M1 is operated in the saturated region. As opposed to this, when the AGC control voltage VAGC becomes smaller, the drain-source voltage Vds in the source grounded first MOS transistor M1 becomes smaller. The operational point of the first MOS transistor M1 then shifts from the saturated region to the nonsaturated region in a region where the AGC control voltage VAGC is Vds<Vgs−Vth (regions A and B in FIG. 4).

The relational expressions of a drain current Id in the nonsaturated region and the saturated region are as shown in (Expression 1) and (Expression 2) in FIG. 13. When the operational point of the first MOS transistor M1 changes, the relational expression of the drain current Id changes. Namely, the drain current Id is expressed as shown in (Expression 1) in FIG. 13 in the nonsaturated region, and the drain current Id is expressed as shown in (Expression 2) in FIG. 13 in the saturated region.

In addition, in above (Expression 1) and (Expression 2), symbol W denotes a gate width of the first MOS transistor M1, symbol L denotes a gate length of the first MOS transistor M1, symbol $\mu_0$ denotes a mobility of a carrier, and symbol Cox denotes a capacitance of a gate oxide film per unit area.

The gain expressed in decibels abruptly changes with respect to the change in AGC control voltage VAGC in the region B (nonsaturated region) in FIG. 4 because the mutual conductance gm is proportional to the drain-source voltage Vds in the nonsaturated region. The mutual conductance gm is obtained by differentiating above (Expression 1) and (Expression 2) with the gate-source voltage Vgs, and expressed as in (Expression 3) and (Expression 4) in FIG. 14.

In addition, although the mutual conductance gm in the saturated region does not change when the drain current Id is constant as shown in (Expression 4), in reality, the mutual conductance gm changes due to a channel modulation effect, and hence the gain slightly changes even in a region C (saturated region) in FIG. 4.

As opposed to the prior art as described above, in the present embodiment, the second MOS transistor M2 and the fourth MOS transistor M4 are differentially connected to each other, and the AGC control voltage VAGC is applied to the gate of the fourth MOS transistor M4, thereby to control the gain. Further, a constant bias voltage VB is applied to the gate of the second MOS transistor M2 also during the gain control.

Thereby, a constant current is supplied to the first MOS transistor M1 independently of the gain control, and the drain current in the second MOS transistor M2 is bypassed to the fourth MOS transistor M4, to perform the gain control. Further, since the drain-source voltage Vds in the first MOS transistor M1 does not significantly change even when the AGC control voltage VAGC is changed, the first MOS transistor M1 is operated constantly in the saturated region.

Figure 5:
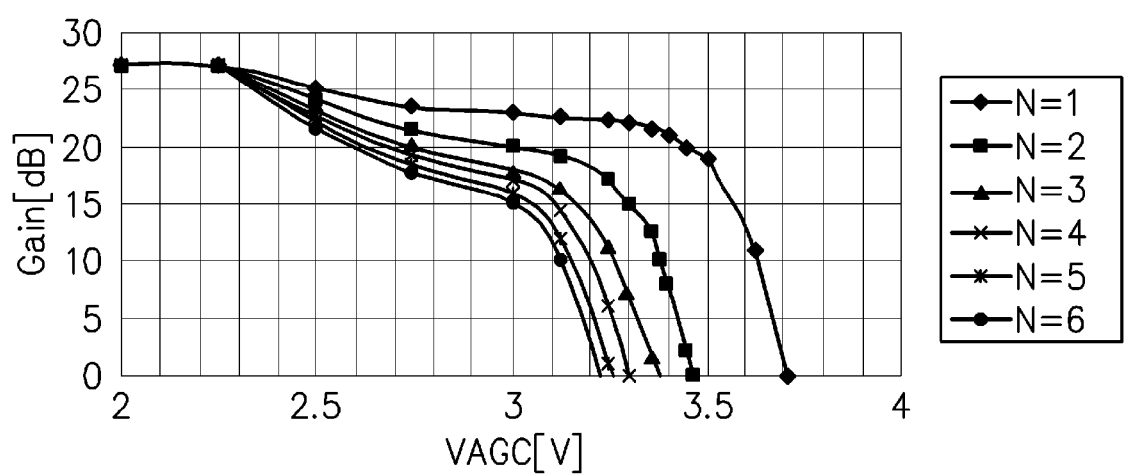
FIG. 5 is a view showing an AGC control characteristic according to a first embodiment.
Figure 6A:
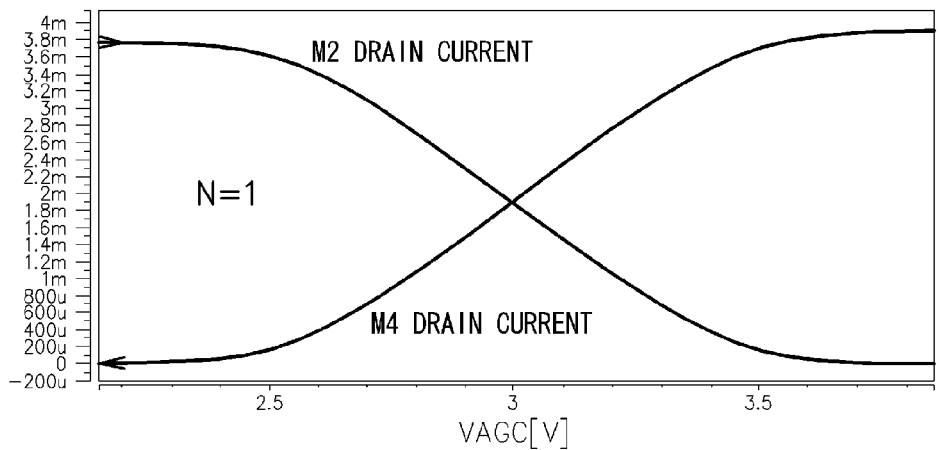
FIG. 6A to 6C are views showing a characteristic of a drain current flowing in a second MOS transistor M2 and a fourth MOS transistor M4 in the first embodiment.
Figure 6B:
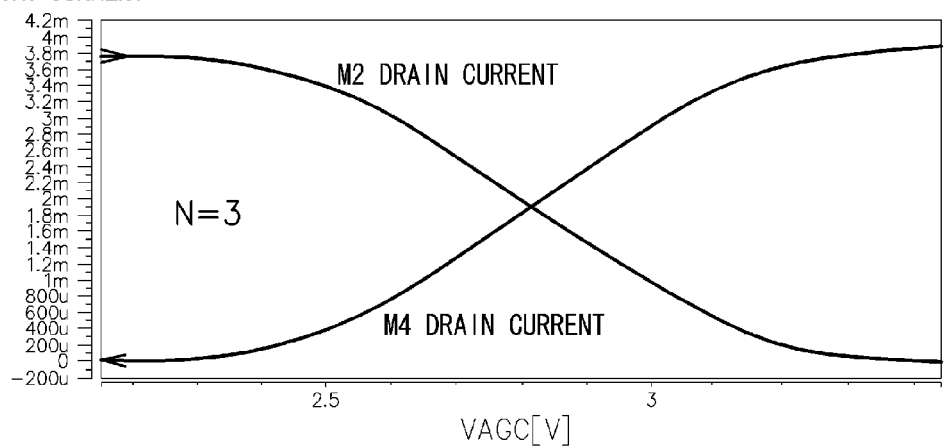
Figure 6C:
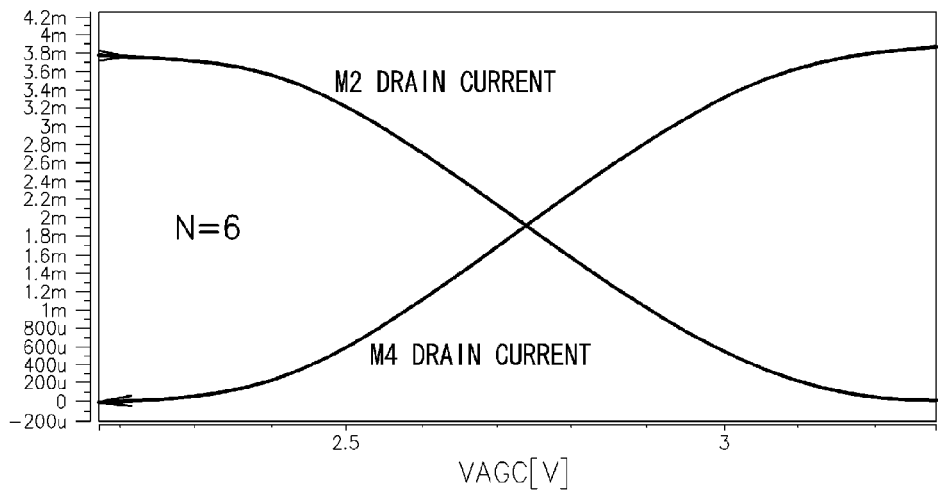

Moreover, the device areas of the second MOS transistor M2 and the fourth MOS transistor M4 are varied in the present embodiment. Such a variation causes a change in operational point of a differential amplifier, thereby improving the AGC control characteristic. FIG. 5 is a view showing the AGC control characteristic according to the present embodiment. FIGS. 6A to 6C are views showing a characteristic of the drain current flowing in the second MOS transistor M2 and the fourth MOS transistor M4 in the present embodiment.

In FIG. 5, the axis of abscissa shows the AGC control voltage VAGC, and the axis of ordinates shows the gain. Since the second MOS transistor M2 and the fourth MOS transistor M4 are differentially connected to each other, change in gain with respect to the AGC control voltage VAGC is opposite to that in FIG. 2. In FIG. 5, respective characteristics in the cases of increasing the device area of the fourth MOS transistor M4 by N times of the second MOS transistor M2 (N=1, 2, 3, 4, 5, 6) are shown. In FIG. 6, respective characteristics in the cases of setting N=1, 3, 6 are shown.

Figure 2:
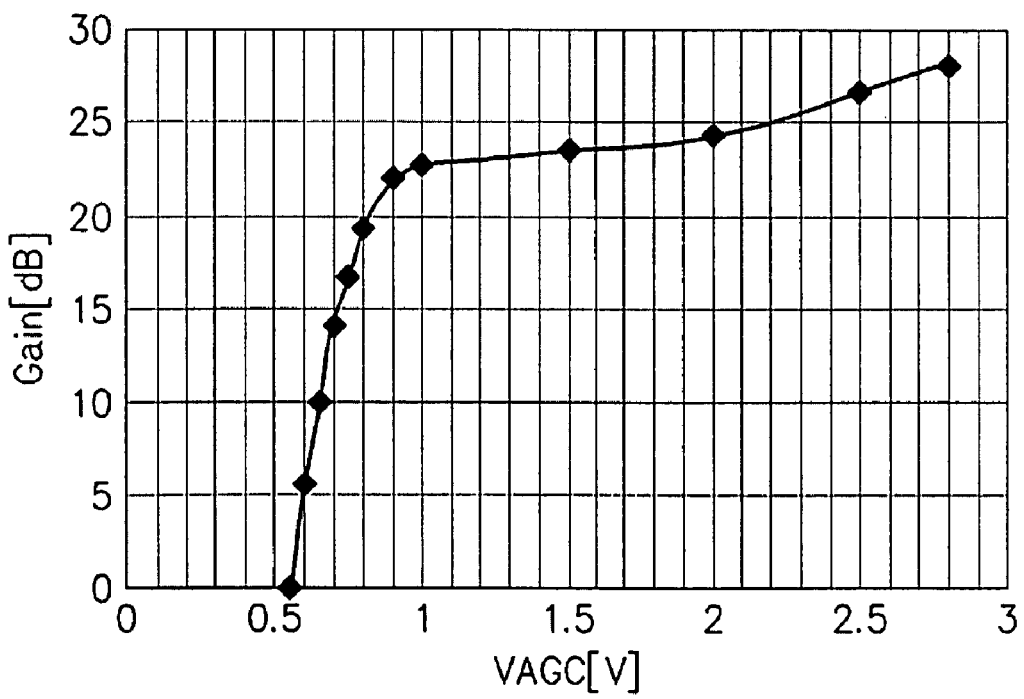
FIG. 2 is a view showing a conventional AGC control characteristic.

As shown in FIG. 5, for example with N=1 (with the device areas of the second MOS transistor M2 and the fourth MOS transistor M4 being identical), the amount of change in AGC control voltage VAGC is about 0.6 V when the gain changes from 0 to 22.5 dB. As opposed to this, as shown in FIG. 2, the amount of change in AGC control voltage VAGC is about 0.45 V when the gain changes from 0 to 22.5 dB in the conventional AGC control characteristic. As thus described, in the case of N=1, the AGC control sensitivity has been improved by about 33%.

Further, with N=1, the gain changes by about 20 dB in a slight narrow region of the AGC control voltage VAGC of about 3.5 to 3.7 V. The amount of change in drain current in the second MOS transistor M2 at this time is about 150 μA as shown in FIG. 6A.

On the other hand, for example with N=6, as shown in FIG. 5, the gain changes by about 20 dB in a relatively broad region of the AGC control voltage VAGC of about 2.6 to 3.25 V. The amount of change in drain current in the second MOS transistor M2 at this time is about 2.6 mA as shown in FIG. 6C. Therefore, by setting of N=6, the control range for the drain current not larger than 20 dB can be expanded by about 17 times as compared with the case of N=1. Further, by setting of N=6, the amount of change in AGC control voltage VAGC in a range of the gain of 0 to 20 dB can be improved from 0.2 V in the case of N=1 to 0.65 V.

As specifically described above, according to the present embodiment, it is possible to suppress an abrupt change in gain expressed in decibels even in a region where the AGC control voltage VAGC is small. Namely, the sensitivity of the change in gain with respect to the AGC control voltage VAGC can be lowered. Further, the drain current in the first MOS transistor M1 is constant independently of the gain control, thereby facilitating setting of a dynamic range, a noise function and the like to the optimum values.

Second Embodiment

Figure 7:
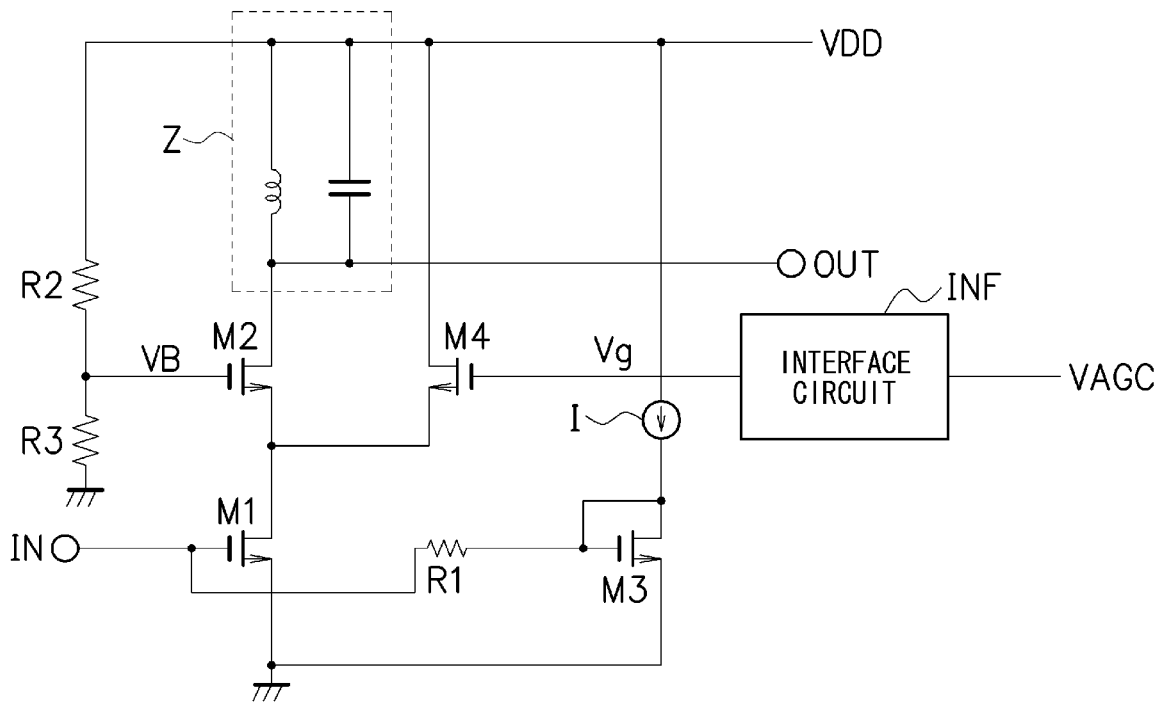
FIG. 7 is a view showing a constitutional example of an automatic gain control circuit according to a second embodiment.

Next, a second embodiment of the present invention is described. FIG. 7 is a view showing a constitutional example of an automatic gain control circuit according to the second embodiment. It is to be noted that in FIG. 7, constituents provided with symbols identical to the symbols shown in FIG. 3 have functions identical to those in FIG. 3, and repeated descriptions are omitted here.

As shown in FIG. 7, in the second embodiment, an interface circuit INF is further provided in addition to the configuration according to the first embodiment shown in FIG. 3. The interface circuit INF is inputted with the AGC control voltage VAGC and converts this voltage into the gate application voltage Vg. The interface circuit INF then supplies the gate of the fourth MOS transistor M4 with the converted gate application voltage Vg.

The operation of the AGC is realized by controlling the gate application voltage Vg which is inputted into the gate of the fourth MOS transistor M4 differentially connected to the second MOS transistor M2. For example, when an interference wave is detected from a received signal and thus a gain of the automatic gain control circuit needs to be attenuated, the AGC control voltage VAGC is increased by a control circuit, not shown. The interface circuit INF is inputted with the AGC control voltage VAGC and converts this voltage into the gate application voltage Vg, and inputs the converted result into the gate of the fourth MOS transistor M4, thereby to control the gain of differential amplification.

Next, a conversion process performed by the interface circuit INF is described in details. The following two kinds of methods are applicable as the conversion process performed by the interface circuit INF.

Method 1) Allocation of currents to the second MOS transistor M2 and the fourth MOS transistor M4, which are differentially connected to each other, is changed to realize the gain control. Specifically, in the interface circuit INF, the AGC control voltage VAGC is subjected to function conversion by square root calculation to generate the gate application voltage Vg, and this voltage is supplied to the gate of the fourth MOS transistor M4 so that a drain current Id' in the fourth MOS transistor M4 becomes proportional to the AGC control voltage VAGC.

Method 2) In the AGC control characteristic shown in FIG. 5, the region where the amount of change in gain is large is made linearly approximate to a region where the amount of change is small. Specifically, in the interface circuit INF, a linear approximation conversion is performed which makes a linear function, expressing the AGC control characteristic in a first region where the AGC control voltage VAGC is larger than a threshold V1, approximate to a linear function expressing the AGC control characteristic in a second region where the AGC control voltage VAGC is not larger than the threshold V1, and the gate application voltage Vg after converted is supplied to the gate of the fourth MOS transistor M4.

Detailed descriptions on Methods 1 and 2 are given below. First, Method 1 is described. In the first region where the AGC control voltage VAGC is larger than the threshold V1, the fourth MOS transistor M4 operates constantly in the saturated region. Therefore, the drain current Id' therein is given by the similar relational expression to above (Expression 2), and the drain current Id' is proportional to the square of the gate-source voltage Vgs (the AGC control voltage VAGC in the case of absence of the interface circuit INF). Therefore, the AGC control voltage VAGC is converted into the gate application voltage Vg according to a relational expression using square root calculation as (Expression 5) in FIG. 15, and the converted voltage Vg is supplied to the gate of the fourth MOS transistor M4 so that the drain current Id' in the fourth MOS transistor M4 becomes proportional to the AGC control voltage VAGC.

Namely, in the interface circuit INF, "$Vg=\sqrt{VAGC}+Vth$" is calculated, and the gate application voltage Vg obtained as a result of the calculation is applied to the gate of the fourth MOS transistor M4 so that the drain current Id' in the fourth MOS transistor M4 becomes proportional to the AGC control voltage VAGC. This allows securement of linearity of the gain with respect to the AGC control voltage VAGC, as well as reduction in gain control sensitivity that was effective with the square of the AGC control voltage VAGC. It is to be noted that the fixed bias voltage VB of the second MOS transistor M2 at this time can be determined such that the gain is 0 db when $Vg=\sqrt{VAGC}+Vth$.

Figure 8:
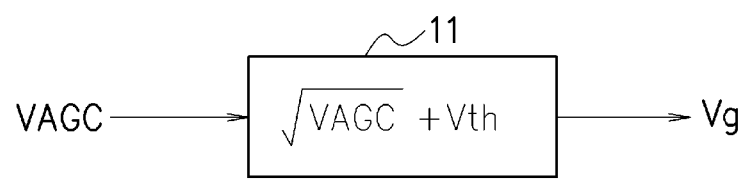
FIG. 8 is a view showing a constitutional example of an interface circuit INF in the case of adopting Method 1 in the second embodiment.
Figure 9:
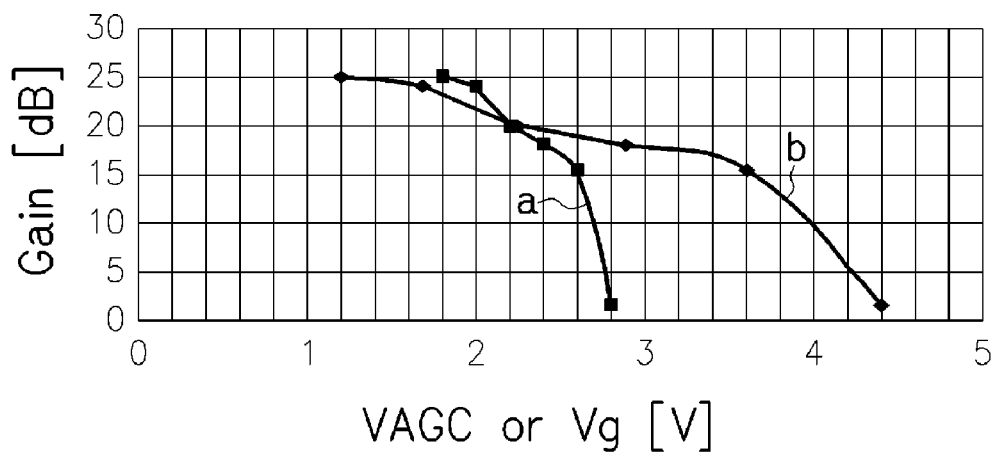
FIG. 9 is a view showing an AGC control characteristic in the case of adopting Method 1 in the second embodiment.

As thus described, the configuration of the interface circuit INF in the case of applying Method 1 is as shown in FIG. 8. In the interface circuit INF shown in FIG. 8, a function calculating portion 11 is provided, the AGC control voltage VAGC is inputted and subjected to function conversion by calculating "$Vg=\sqrt{VAGC}+Vth$", and the gate application voltage Vg after converted is supplied to the gate of the fourth MOS transistor M4. Provision of such an interface circuit INF allows the AGC control characteristic shown by "a" in FIG. 9 to be improved to the AGC control characteristic as shown by "b".

Figure 10:
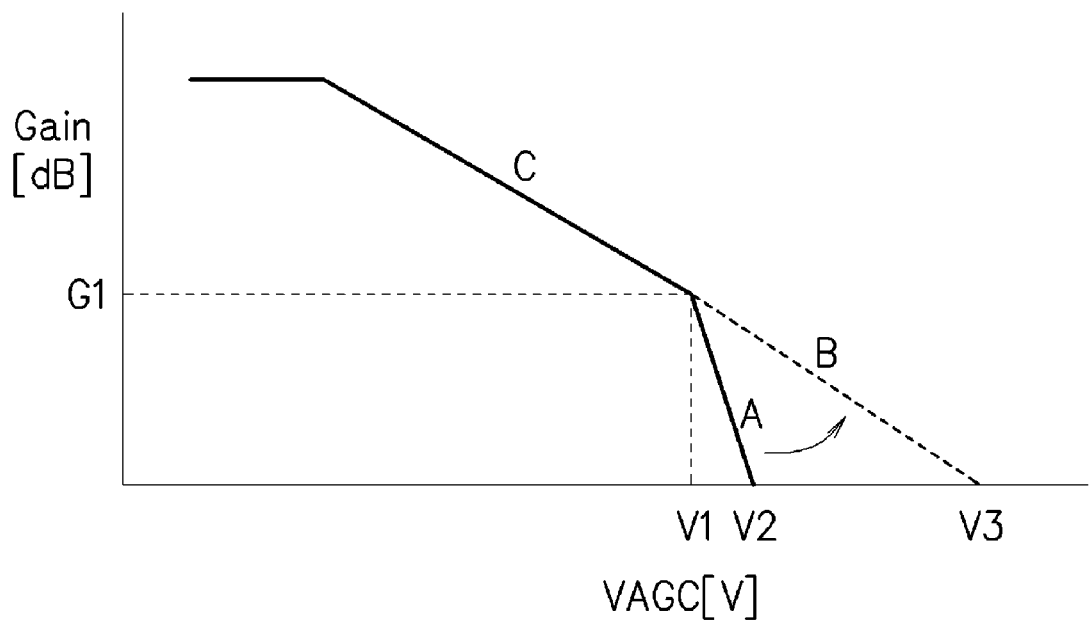
FIG. 10 is a view showing the AGC control characteristic, shown in FIG. 5, in schematic form for explaining Method 2 in the second embodiment.

Next, Method 2 is described. FIG. 10 is a view showing the AGC control characteristic, shown in FIG. 5, in schematic form. In FIG. 10, a waveform shown by a solid line (portion shown by C and A) shows the AGC control characteristic in the case of N=6 in FIG. 5. In the case of N=6, V1=3 V, V2=3.25 V, and V3=4.2 V.

As shown in FIG. 10, by applying the first embodiment, although the AGC control characteristic (gain control sensitivity) in the second region where the AGC control voltage VAGC is not larger than the threshold V1 is improved (portion of the straight line C), an improvement factor of the AGC control characteristic in the first region where the AGC control voltage VAGC is larger than the threshold V1 is small (portion of the straight line A). Method 2 is a method for further improving the characteristic in the first region.

Namely, in Method 2 a linear function A expressing the AGC control characteristic in the first region where the AGC control voltage VAGC is larger than the threshold V1 is made approximate to a linear function C expressing the AGC control characteristic in the second region where the AGC control voltage VAGC is not larger than the threshold V1. In other words, the linear function A in the first region is converted into a linear function B given by linearly extending the linear function C in the second region to the first region.

Since an inclination α of the linear function A is expressed by: $\alpha=(V2-V1)/G1$, and an inclination β of the linear function B is expressed by: $\beta=(V3-V1)/G1$. Since "$\beta/\alpha=(V3-V1)/(V2-V1)=(4.2-3)/(3.25-3)=4.8$", the equation of the linear approximation from the AGC control voltage VAGC expressed by the linear function A to the gate application voltage Vg expressed by the linear function B is: $Vg=4.8(VAGC-3)+3$.

Figure 11:
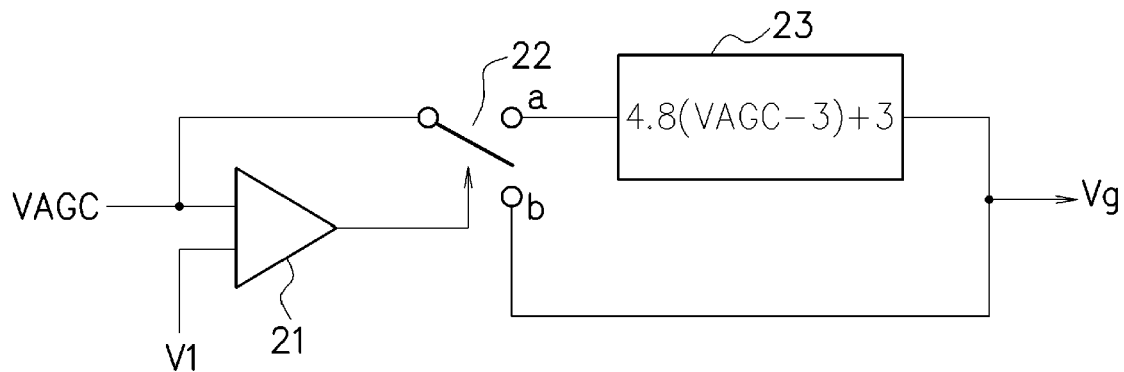
FIG. 11 is a view showing a constitutional example of the interface circuit INF in the case of adopting Method 2 in the second embodiment.

Therefore, the configuration of the interface circuit INF in the case of adopting Method 2 is as shown in FIG. 11. In the interface circuit INF shown in FIG. 11 comprises a comparator 21, a switch 22, and a function calculating portion 23. The comparator 21 compares the magnitudes of the AGC control voltage VAGC and the threshold V1, and outputs a Hi signal or a Low signal according to the comparison result, thereby to control the switch 22.

The switch 22 is inputted with the AGC control voltage VAGC and switches whether to supply the inputted voltage to the function calculating portion 23 or not to supply but directly output the inputted voltage. For example, when the comparator 21 determines VAGC>V1, and outputs the Hi signal, the switch 22 is switched to a node "a" side and the AGC control voltage VAGC is supplied to the function calculating portion 23. On the other hand, when the comparator 21 determines VAGC≦V1, and outputs the Low signal, the switch 22 is switched to a node "b" side, and the AGC control voltage VAGC is directly outputted as the gate application voltage Vg.

The function calculating portion 23 obtains the gate application voltage Vg from the AGC control voltage VAGC by performing a linear approximate calculation: Vg=4.8 (VAGC−3)+3, and supplies the calculated voltage to the gate of the fourth MOS transistor M4.

It is to be noted that, although the example of using the AGC control characteristic with N=6 to convert the linear function A into the linear function B was described here, the respective AGC control characteristics with N=1, 2, 3, 4 and 5 may be used. However, a larger N value is more preferable since the smaller the N value is, the larger the value of V3 is, which requires a larger AGC control voltage VAGC.

As specifically described above, in the first embodiment, the fourth MOS transistor M4 for gain control is differentially connected to the gate grounded second MOS transistor M2 constituting the cascode amplifier. Further, the device areas of the second MOS transistor M2 and the fourth MOS transistor M4 are made different, to change the operational points of the transistors. The AGC control voltage VAGC is then applied to the gate of the fourth MOS transistor M4, to vary the drain current in the gate grounded second MOS transistor M2 so that the gain control characteristic is obtained.

It is thereby possible to lower the sensitivity of the characteristic of the change in drain current with respect to the change in AGC control voltage VAGC, so as to suppress an abrupt change in gain expressed in decibels even in a region where the AGC control voltage VAGC is small. It is further possible to make the drain current in the first MOS transistor M1 constant independently of the gain control, so as to facilitate setting of a dynamic range, a noise function and the like to the optimum values.

Further, in the second embodiment, the interface circuit INF that performs function conversion is added, to supply the gate of the fourth MOS transistor M4 with the gate application voltage Vg obtained from the AGC control voltage VAGC by function conversion. It is thereby possible to further improve the sensitivity of the change in gain with respect to the AGC control voltage VAGC. Namely, it is possible to make the gain control sensitivity small even in a region where the AGC control voltage VAGC is large. Simultaneously with this, it is possible to obtain the linearity over a broad range of the AGC control voltage VAGC.

It is to be noted that the second embodiment is configured with the aim of obtaining the linearity as well as improvement in gain control sensitivity. If more importance is attached to the improvement in gain control sensitivity, the relational expression is not restricted to those as shown in FIGS. 8 and 11, but a relational expression that makes the gain control sensitivity smaller can be applied.

Figure 12:
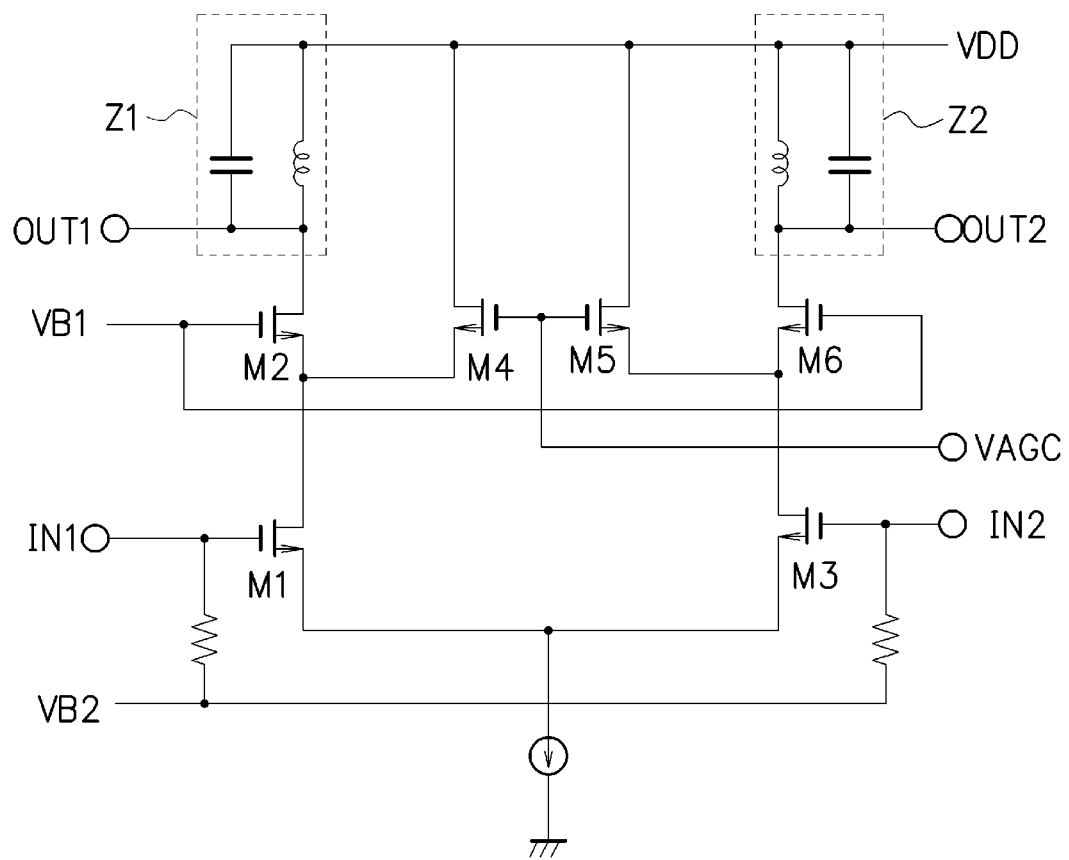
FIG. 12 is a view showing a modified example of the automatic gain control circuit according to the first embodiment.

Further, as a modified example of FIG. 3, the cascode amplifier may be used as a configuration of a differential input and a differential output, as shown in FIG. 12. Further, the interface circuit INF shown in FIG. 7 may further be provided in the configuration in FIG. 12.

As for other respects, the first and second embodiments each represent just one example of embodiments in implementing the present invention, and a technical scope of the present invention should not be restrictedly construed by those embodiments. Namely, it is possible to implement the present invention in a variety of forms without departing from its spirit or its principle characteristic.

INDUSTRIAL APPLICABILITY

The present invention is useful in an automatic gain control circuit that adjusts an amplification gain of a signal by a cascode amplifier configured by cascode connecting MOS transistors.

The invention claimed is:

1. An automatic gain control circuit. comprising:
   a first MOS transistor and a second MOS transistor that constitute a cascode amplifier; and
   a gain control MOS transistor differentially connected to said second MOS transistor;
   wherein
   said second MOS transistor is formed so as to be supplied with a fixed bias voltage at its gate, while said gain control MOS transistor is formed so as to be supplied with a gain control voltage at its gate,
   a device area ratio of said second MOS transistor to said gain control MOS transistor is one to N (N≧1), and
   an interface circuit, which is inputted with said gain control voltage and performs function conversion of this voltage by square root calculation, to supply the gain control voltage after converted to the gate of said gain control MOS transistor.

2. An automatic gain control circuit, comprising:
   a first MOS transistor and a second MOS transistor that constitute a cascode amplifier; and
   a gain control MOS transistor differentially connected to said second MOS transistor;
   wherein
   said second MOS transistor is formed so as to be supplied with a fixed bias voltage at its gate, while said gain control MOS transistor is formed so as to be supplied with a gain control voltage at its gate,
   a device area ratio of said second MOS transistor to said gain control MOS transistor is one to N (N≧1), and
   an interface circuit, which is inputted with said gain control voltage and performs linear approximate conversion that makes a linear function, representing a gain control characteristic in a first region where said gain control voltage is larger than a threshold, approximate to a linear function representing a gain control characteristic in a second region where said gain control voltage is not larger than said threshold, to supply the gain control voltage after convened to the gate of said gain control MOS transistor.

* * * * *